US012751247B2

(12) United States Patent
Lee et al.

(10) Patent No.: US 12,751,247 B2
(45) Date of Patent: Sep. 29, 2026

(54) WAFER ALIGNMENT ASSEMBLY OF THE SOLDER REFLOW SYSTEM

(71) Applicant: Taiwan Semiconductor Manufacturing Company, Ltd., Hsinchu (TW)

(72) Inventors: Chia-Ching Lee, Taoyuan (TW); Tung-Hsuan Tsai, Miaoli County (TW); Hsin-Tai Wang, Taoyuan (TW); Chen Liang Chang, Taipei (TW); Kuo Hui Chang, Taoyuan (TW); Chi-Chun Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1034 days.

(21) Appl. No.: 17/817,603

(22) Filed: Aug. 4, 2022

(65) Prior Publication Data

US 2024/0047255 A1 Feb. 8, 2024

(51) Int. Cl.

| | |
|---|---|
| ***H10P 72/50*** | (2026.01) |
| ***H10P 72/30*** | (2026.01) |
| ***H10W 72/00*** | (2026.01) |

(52) U.S. Cl.

CPC .......... *H10P 72/50* (2026.01); *H10P 72/3202* (2026.01); *H10P 72/3302* (2026.01); *H10P 72/3304* (2026.01); *H10W 72/071* (2026.01); *H10W 72/07234* (2026.01)

(58) Field of Classification Search

CPC .. H10P 72/50; H10P 72/3202; H10P 72/3302; H10P 72/3304; H10P 72/3314; H10W 72/071; H10W 72/07234; H01L 24/75

See application file for complete search history.

(56) References Cited

U.S. PATENT DOCUMENTS

2022/0181177 A1* 6/2022 Becker ................ H10P 72/0602

FOREIGN PATENT DOCUMENTS

TW 434073 B 5/2001

OTHER PUBLICATIONS

The office action and search report issued in Taiwanese corresponding application 112116522, mailed on Jun. 23, 2026.

* cited by examiner

*Primary Examiner* — Robert G Bachner

(74) *Attorney, Agent, or Firm* — Kilpatrick Townsend & Stockton LLP

(57) ABSTRACT

A wafer alignment assembly is provided. The wafer alignment assembly includes: a first tapered wall extending in a first horizontal direction; a first spring wall attached to an inner surface of the first tapered wall; a first set of conveyor rollers configured to rotate; a second tapered wall extending in the first horizontal direction, wherein the first tapered wall and the second tapered wall are characterized by a tapered shape that facilitates entry of a wafer assembly; a second spring wall attached to an inner surface of the first tapered wall; and a second set of conveyor rollers configured to rotate.

20 Claims, 8 Drawing Sheets

WAFER ALIGNMENT ASSEMBLY OF THE SOLDER REFLOW SYSTEM

FIELD

Embodiments of the present disclosure relate generally to semiconductor processing, and more particularly to solder reflow system.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various dielectric, semiconductor, and metal layers. The areas of the layer that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
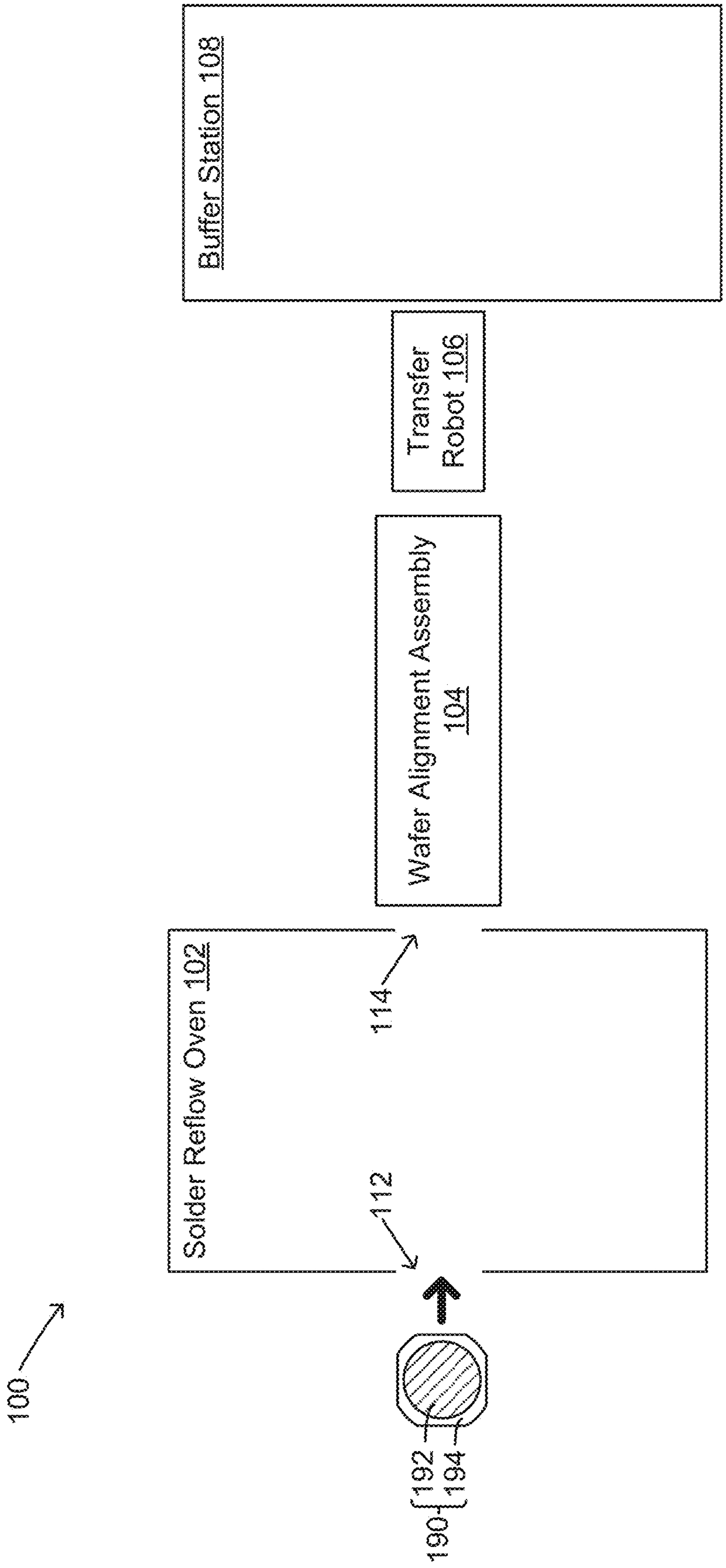
FIG. 1 is a schematic diagram illustrating an example solder reflow system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Packaging technologies were once considered just back-end processes. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Reflow soldering (sometimes also referred to as a "reflow process") is a process widely used in various packaging technologies. In a reflow soldering process, a solder paste (i.e., a sticky mixture of powdered solder and flux) is used to temporarily attach one or thousands of tiny electrical components to their contact pads, after which the entire assembly is subjected to controlled heat. The solder paste reflows in a molten state, creating permanent solder joints. Heating may be accomplished by passing the assembly through a solder reflow oven (sometimes also referred to as a "reflow oven"). An example of solder reflow ovens is a solder reflow oven manufactured by Heller Industries, and the reflow process may sometimes be referred to as a "Heller reflow process."

Reflow soldering with long industrial convection ovens is a common method of soldering surface mount technology (SMT) components to a printed circuit board (PCB). Each segment of the oven has a regulated temperature, according to the specific thermal requirements of each assembly. Reflow ovens meant specifically for the soldering of SMT components may also be used for through-hole components by filling the holes with solder paste and inserting the component leads through the paste.

The goal of the reflow process is for the solder paste to reach the eutectic temperature at which the particular solder alloy undergoes a phase change to a liquid or molten state. At this specific temperature range, the molten alloy demonstrates properties of adhesion. Molten solder alloy behaves much as water, with properties of cohesion and adhesion. With sufficient flux, in the state of liquidus, molten solder alloys will exhibit a characteristic called "wetting." Wetting is a property of the alloy when within its specific eutectic temperature range. Wetting is a necessary condition for the formation of solder joints that meet the criteria in the industry.

After the reflow process, a wafer is transferred to a buffer station through, for example, a wafer transportation assembly and a transfer robot. The wafer transportation assembly is a transportation mechanism configured to transport the wafer coming out of the reflow oven to a stopper and adjust the position (e.g., yaw, pitch, and roll) of the wafer to some extent, if necessary. However, due to the warpage of the wafer resulting from the reflow process, the wafer may not necessarily have the ideal position when it enters the wafer transportation assembly. Even though technologies, such as conveyors with differential speed, may be used, the results are sometimes unsatisfactory. For example, wafer scrap may occur, which is very costly. In some situations, the wafer may even be stuck in the wafer transportation assembly (sometimes referred to as "wafer congestion" or "wafer clogging"), and the manpower associated with fixing the stuck wafer and troubleshooting the problems is costly as well. Productivity is negatively impacted accordingly.

In accordance with some aspects of the disclosure, a wafer alignment assembly is provided. The wafer alignment assembly includes, among other elements, a first tapered wall, a second tapered wall, a first spring wall attached to an inner surface of the first tapered wall, a second spring wall attached to an inner surface of the first tapered wall, a first set of conveyor rollers, and a second set of conveyor rollers.

The first tapered wall and the second tapered wall are characterized by a tapered shape, which facilitates the smooth entry of the wafer assembly and reduces the possibility of collision of the wafer assembly against the pair of tapered walls. Additionally, a torque generated by the first spring wall and the second spring wall can rotate the wafer assembly and reset the position of the wafer assembly to the desired position. This can also prevent the wafer assembly from being stuck. Lastly, at least one of the first set of conveyor rollers and at least one of the second set of conveyor rollers are characterized by roller caps, which can result in momentarily vertical movement of the wafer assembly. The friction that prevents the wafer assembly from free movement horizontally is released momentarily as well, thereby facilitating the reset of the wafer assembly to the desired position. The function of the pair of spring walls can be further enhanced when the friction is released momentarily.

Consequently, the following advantages can be achieved. The possibility of wafer collision and wafer scrap is reduced. The wafer assembly is prevented from being stuck. Manpower in the semiconductor processing can be saved. The troubleshooting period, if there is any, can be shortened. Details of various aspects of the disclosure will be described below with reference to FIGS. 1-12.

Example Solder Reflow System

FIG. 1 is a schematic diagram illustrating an example solder reflow system 100 in accordance with some embodiments. In the example shown in FIG. 1, the solder reflow system 100 includes, among other components, a solder reflow oven 102, a wafer alignment assembly 104, a transfer robot 106, and a buffer station 108.

A wafer assembly 190, which includes a wafer 192 and a wafer frame 194, is transferred to the solder reflow oven 102 through an inlet 112 of the solder reflow over 102. After the reflow process, the wafer assembly 190 is transferred out of the solder reflow oven 102 through an outlet 114 of the solder reflow over 102. In some embodiments, the outlet 114 is aligned with the inlet of the wafer alignment assembly 104. While only one wafer 192 and one wafer frame 194 are shown in FIG. 1, it should be understood that this is not intended to be limiting, and multiple wafers (e.g., a stack of wafers) can be processed in the solder reflow over 102.

In some implementations, the solder reflow oven 102 includes a reflow chamber, which has built-in heating/cooling plates. The wafer 192 is placed in close proximity to one of the built-in heating/cooling plates at a certain distance. The distance can prevent the formation of hot/cold zones that may be created when the wafer 192 is in contact with the built-in heating/cooling plate due to, for example, warpage. In other implementations, cooling is achieved using cooling gas flow.

In some implementations, the reflow chamber of the solder reflow oven 102 further includes a vacuum port and a gas port. In some examples, controlled heat can be achieved in vacuum using the vacuum port. In other examples, controlled heat can be achieved in a non-reactive gas environment using the gas port. Examples of the non-reactive gas include nitrogen, argon, helium, hydrogen, and the like.

The temperature profile (sometimes also referred to as the "thermal profile") of the reflow process allows for the reflow of solder onto the adjoining surfaces to create permanent solder joints, without overheating and damaging the electrical components beyond their temperature tolerance. There are usually four stages (sometimes also referred to as "zones"), namely the preheat stage, the thermal soak stage, the reflow stage, and the cooling stage.

In the preheat stage, the wafer 192 is safely and consistently heated to a soak temperature. In addition, the preheat stage also provides an opportunity for volatile solvents in the solder paste to outgas. The thermal soak stage is typically an exposure (e.g., 60 to 120 seconds) for the removal of solder paste volatiles and the activation of the fluxes, where the flux components begin oxide reduction on component leads and pads. At the end of the thermal soak stage, a thermal equilibrium of the entire wafer 192 is desired before the reflow stage.

In the reflow stage, the peak temperature is reached. A common peak temperature is 20-40° C. above liquidus. The peak temperature is restricted by the components on the wafer 192 that have the lowest tolerance for high temperatures (i.e., the components most susceptible to thermal damage). Conversely, a temperature that is not high enough may prevent the solder paste from reflowing adequately.

In the cooling stage, the wafer 192 is gradually cooled, and the solder joints are solidified. Proper cooling inhibits excess intermetallic formation or thermal shock to the components. Typical temperatures in the cooling zone range from 30-100° C. In some embodiments, a relatively fast cooling rate is chosen to create a fine grain structure that is most mechanically sound.

As mentioned above, the wafer assembly 190 is transferred out of the solder reflow over 102, through the outlet 114 of the solder reflow over 102, to the wafer alignment assembly 104. The wafer assembly 190 is conveyed or transported from one end (i.e., the proximate end) to another end (i.e., the distant end) of the wafer alignment assembly 104. As will be explained in detail below with reference to FIGS. 2-9, The wafer alignment assembly 104 can adjust the positioning of the wafer assembly 190 so that wafer scrap and wafer congestion can be prevented or significantly reduced.

After the wafer assembly 190 is conveyed to the distant end, the transfer robot 106 transfers the wafer assembly 190 to the buffer station 108. In some implementations, the transfer robot 106 includes one or more rods connected end to end between a motor and a holding member by one or more bearings. The motor is configured to vertically, horizontally, and/or rotationally move the holding member along the bearings. In one embodiment, the holding member includes one or more blades, and each of the one or more blades includes a pair of laterally spaced fingers typically configured to support the wafer assembly 190.

The buffer station 108 is used as a buffer for balancing the process flow. When a wafer assembly 190 is conveyed to the distant end of the wafer alignment assembly 104, it cannot stay there for a long time because the solder reflow over keeps working and the next wafer assembly might arrive at the same place soon. If the wafer assembly 190 is not transferred to another place, a collision between the wafer assembly 190 and the next wafer assembly will occur. Therefore, the buffer station 108 serves as a buffer to prevent wafer assembly collision. On the other hand, the buffer station 108 can also regulate (i.e., increase or decrease) the temperature according to the process requirements.

Example Wafer Alignment Assembly

Figure 2:
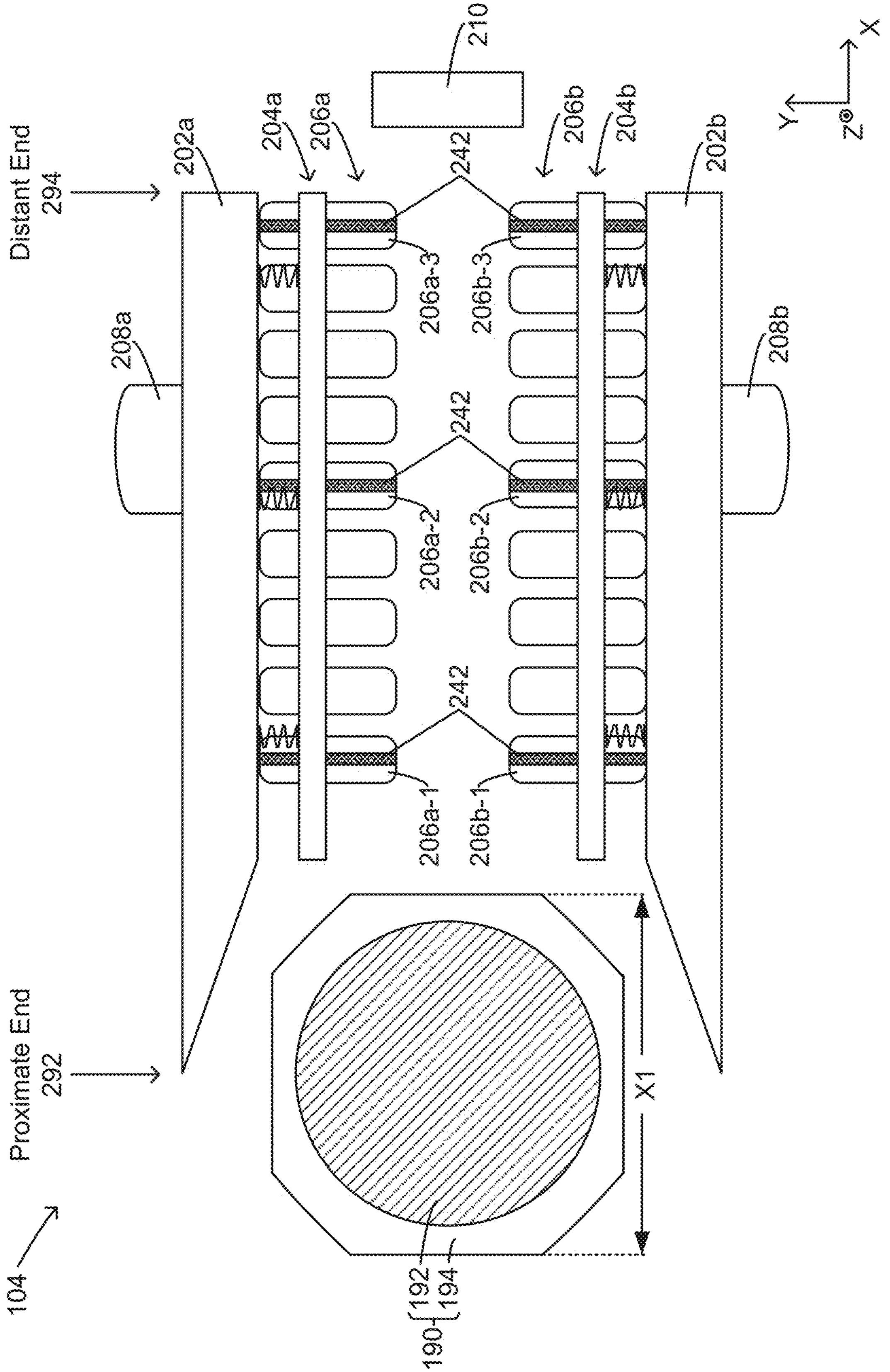
FIG. 2 is a diagram illustrating an example wafer alignment assembly in accordance with some embodiments.

FIG. 2 is a diagram illustrating an example wafer alignment assembly 104 in accordance with some embodiments. In the example shown in FIG. 2, the wafer alignment assembly 104 includes, among other components, a pair of tapered walls 202*a* and 202*b* (collectively, "202"), a pair of spring walls 204*a* and 204*b* (collectively, "204"), two sets of conveyor rollers 206*a* and 206*b* (collectively, "206"), a pair of conveyor motors 208*a* and 208*b* (collectively, "208"), and a wafer stopper 210.

The wafer assembly 190 enters, in the first horizontal direction (i.e., the X-direction shown in FIG. 2), the wafer alignment assembly 104 at the proximate end 292 shown in FIG. 2. The pair of tapered walls 202*a* and 202*b* are characterized by a tapered shape (i.e., a bell-mouth shape) at the proximate end 292. The tapered shape facilitates the smooth entry of the wafer assembly 190 and reduces the possibility of collision of the wafer assembly 190 against the pair of tapered walls 202*a* and 202*b*.

Figure 3:
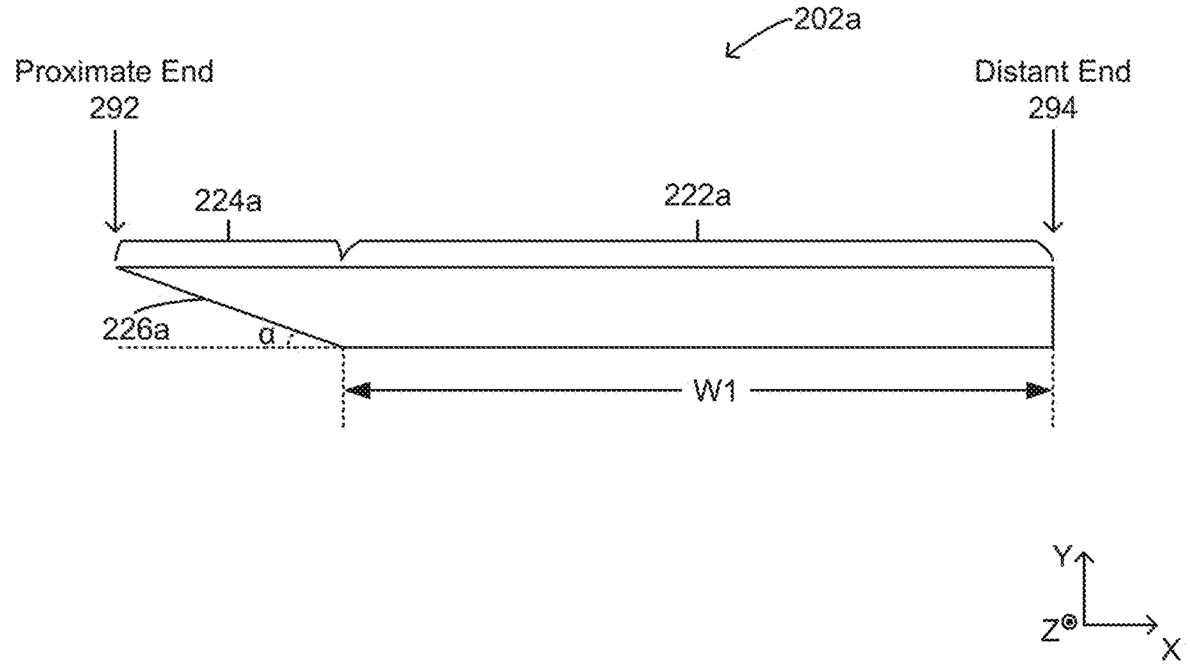
FIG. 3 is a diagram illustrating the tapered wall 202*a* shown in FIG. 2 in accordance with some embodiments.

FIG. 3 is a diagram illustrating the tapered wall 202*a* in accordance with some embodiments. It should be understood that the other tapered wall 202*b* has the same shape and geometries (i.e., symmetric with respect to the X-Z plane shown in FIG. 2) and, therefore, will not be described in detail.

In the example shown in FIG. 2, the tapered wall 202*a* is elongated and extends in the X-direction. The tapered wall 202*a* includes an elongated segment 222*a* extending in the X-direction and a tapered segment 224*a* at the proximate end 292. The tapered segment 224*a* is characterized by a taper angle $\alpha$. The taper angle $\alpha$ is defined as the angle between the X-direction (i.e., the direction in which the tapered wall 202*a* extends) and the hypotenuse 226*a* of the tapered segment 224*a*. In one embodiment, $\alpha$ is equal to 2 degrees. In another embodiment, $\alpha$ is equal to 3 degrees. In yet another embodiment, $\alpha$ is equal to 4 degrees. In still another embodiment, $\alpha$ is larger than 2 degrees and smaller than 4 degrees. As explained above, the tapered segment 224*a* characterized by the taper angle $\alpha$ facilitates the smooth entry of the wafer assembly 190 and reduces the possibility of collision of the wafer assembly 190 against the tapered wall 202*a*.

The elongated segment 222*a* has a length W1 in the X-direction. As shown in FIG. 2, the wafer assembly 190 has a critical dimension X1, which is the dimension of the wafer assembly 190 (i.e., the wafer frame 194) in the X-direction. In one embodiment, the length W1 is larger than one-third of the critical dimension X1 (i.e., $W1/X1>1/3$). In another embodiment, the length W1 is larger than half of the critical dimension X1 (i.e., $W1/X1>1/2$). In yet another embodiment, the length W1 is larger than two-thirds of the critical dimension X1 (i.e., $W1/X1>2/3$). In one embodiment, the elongated segment 222*a* is a rectangular segment.

In some embodiments, the tapered walls 202*a* and 202*b* are made of stainless steel. In other embodiments, the tapered walls 202*a* and 202*b* are made of anodized aluminum. Anodizing is an electrochemical process that converts the metal surface into a durable, corrosion-resistant, and anodic oxide finish. It should be understood that these materials are exemplary rather than limiting, and the tapered walls 202*a* and 202*b* can be made of other suitable materials as needed in other embodiments.

The pair of spring walls 204*a* and 204*b* are attached to the inner surfaces of the pair of tapered walls 202*a* and 202*b*, respectively. The pair of spring walls 204*a* and 204*b* are operable to adjust the position of the wafer assembly 190 if the position of the wafer assembly 190 deviates from its desired position due to, for example, the warpage of the wafer 192, the torque applied to the wafer assembly 190, and the like. The detachable spring walls 204*a* and 204*b* make it easier to upgrade existing platforms in a cost-effective manner.

Figure 4:
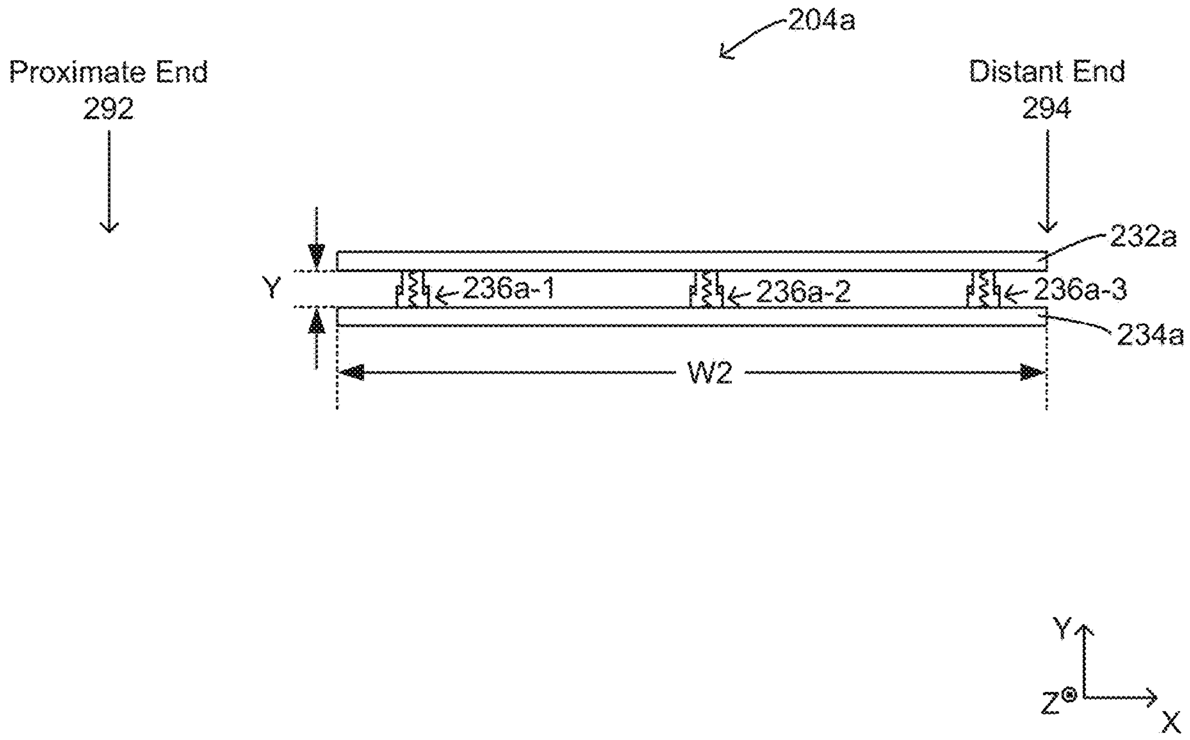
FIG. 4 is a diagram illustrating the spring wall 204*a* shown in FIG. 2 in accordance with some embodiments.

FIG. 4 is a diagram illustrating the spring wall 204*a* in accordance with some embodiments. It should be understood that the other spring wall 204*b* has the same shape, geometries, and components (i.e., symmetric with respect to the X-Z plane shown in FIG. 2) and, therefore, will not be described in detail.

In the example shown in FIG. 4, the spring wall 204*a* includes, among other components, a fixed wall 232*a*, a movable wall 234*a*, and three adjustable connection mechanisms 236*a*-1, 236*a*-2, and 236*a*-3 (collectively, "236*a*"). The fixed wall 232*a* is an elongated wall extending in the X-direction. The fixed wall 232*a* is attached to or mounted on the inner surface of the tapered wall 202*a*. In some implementations, the fixed wall 232*a* is attached to or mounted on the inner surface of the tapered wall 202*a* using welding. In other implementations, the fixed wall 232*a* is attached to or mounted on the inner surface of the tapered wall 202*a* using fasteners such as screws, bolts, clamps, and the like.

The movable wall 234*a* is an elongated wall extending in the X-direction. The movable wall 234*a* is parallel to the fixed wall 232*a* in a free state (i.e., when no force is applied to the movable wall 234*a*). The movable wall 234*a* can move with respect to the fixed wall 232*a*.

The adjustable connection mechanisms 236*a*-1, 236*a*-2, and 236*a*-3 are distributed in the X-direction. The adjustable connection mechanisms 236*a*-1, 236*a*-2, and 236*a*-3 extend substantially in a second horizontal direction (i.e., the Y-direction shown in FIG. 4) and connect the fixed wall 232*a* and the movable wall 234*a*. One end of each of the adjustable connection mechanisms 236*a*-1, 236*a*-2, and 236*a*-3 is attached to the fixed wall 232*a*; another end of each of the adjustable connection mechanisms 236*a*-1, 236*a*-2, and 236*a*-3 is attached to the movable wall 234*a*.

Each of the adjustable connection mechanisms 236*a*-1, 236*a*-2, and 236*a*-3 can adjust its length in the Y-direction, thereby enabling the movement of the movable wall 234*a*. In one implementation, each of the adjustable connection mechanisms 236*a*-1, 236*a*-2, and 236*a*-3 includes an extensible pin structure and a spring inside the extensible pin structure, as shown in FIG. 4. The extensible pin structure includes an inner pin attached to or mounted on the fixed wall 232*a* and an outer pin attached to or mounted on the movable wall 234*a*. The inner pin is inside the oust pin, and the outer pin can move, substantially in the Y-direction, with respect to the inner pin. As such, the extensible pin structure can extend substantially in the Y-direction. The spring inside the extensible pin structure can be compressed or stretched from its resting position and exerts an opposing force approximately proportional to its change in length. In some embodiments, the spring constant (also referred to as "force constant" or "rate") is larger than 0.25 N/mm and smaller than 1.5 N/mm. In other embodiments, the spring constant is larger than 0.5 N/mm and smaller than 1 N/mm.

While each of the adjustable connection mechanisms 236*a*-1, 236*a*-2, and 236*a*-3 is implemented as having an extensible pin structure and a spring inside it in the example described above, it should be understood that the adjustable connection mechanisms 236*a*-1, 236*a*-2, and 236*a*-3 can be implemented in other suitable manners.

Also, while three adjustable connection mechanisms 236*a*-1, 236*a*-2, and 236*a*-3 are shown in FIG. 4, it should be understood that two adjustable connection mechanisms 236*a* or more than three adjustable connection mechanisms 236*a* can be employed in other embodiments.

The fixed wall 232*a* and the movable wall 234*a* both have a length W2 in the X-direction. In one embodiment, the length W2 is equal to the length W1. In other words, the length W2 is the same as the length W1 of the elongated segment 222*a* shown in FIG. 3. In another embodiment, the length W2 is smaller than the length W1.

In some embodiments, the distance Y between the fixed wall 232*a* and the movable wall 234*a* is larger than 2 mm and smaller than 5 mm. In other embodiments, the distance Y between the fixed wall 232*a* and the movable wall 234*a* is larger than 3 mm and smaller than 4 mm.

Figure 5:
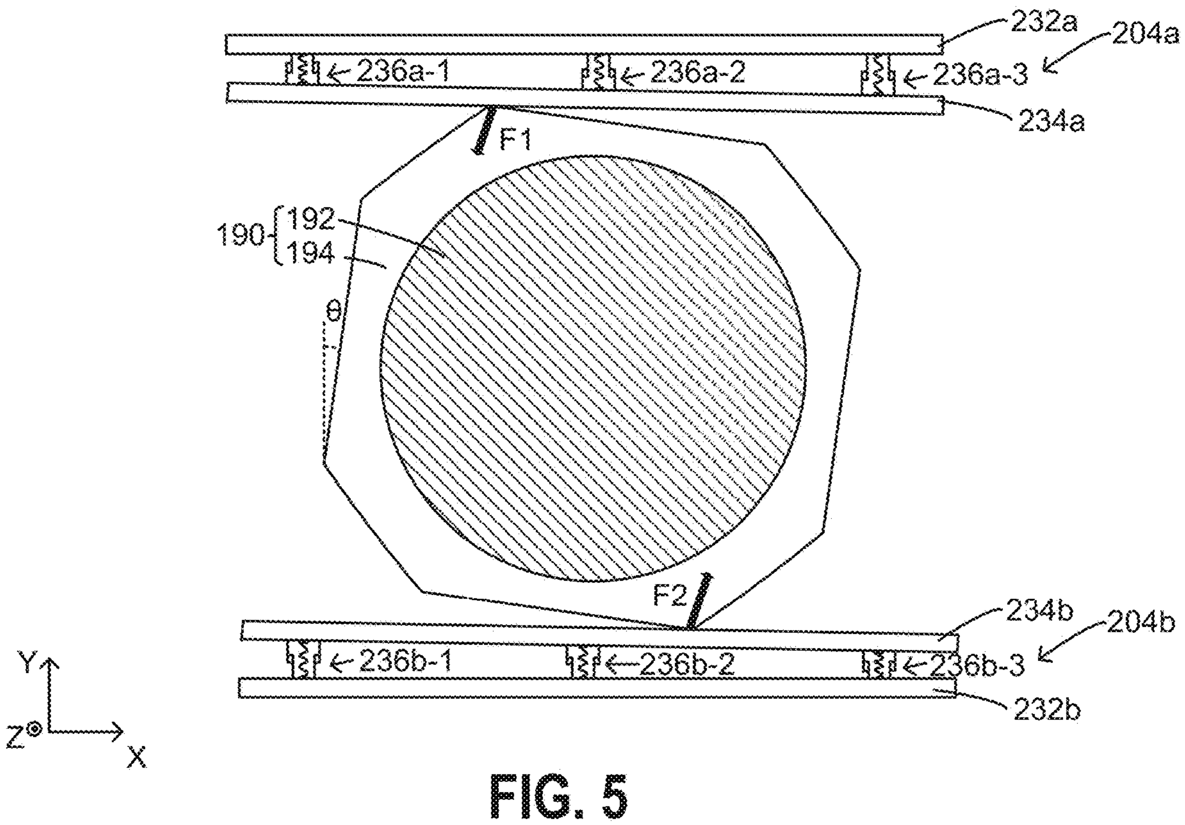
FIG. 5 is a diagram illustrating the interaction between the wafer assembly 190 and the pair of spring walls 204*a* and 204*b* shown in FIG. 2 in accordance with some embodiments.

FIG. 5 is a diagram illustrating the interaction between the wafer assembly 190 and the pair of spring walls 204*a* and 204*b* in accordance with some embodiments. In the example shown in FIG. 5, the wafer assembly 190 deviates from its desired position. Specifically, the wafer assembly 190 rotates with respect to its desired position, and the deviation is characterized by a rotational angle θ shown in FIG. 5.

As shown in FIG. 5, the movable wall 234*a* of the spring wall 204*a* and the movable wall 234*b* of the spring wall 204*b* are displaced due to the deviation of the wafer assembly 190. As a result, the spring of the adjustable connection mechanism 236*a*-1 is compressed, a force F1 is applied to the wafer assembly 190 at its contact area with the movable wall 234*a*; the spring of the adjustable connection mechanism 236*b*-3 is compressed, a force F2 is applied to the wafer assembly 190 at its contact area with the movable wall 234*b*. A torque (i.e., the cross product of the position vector and the force vector) is generated by the forces F1 and F2. The torque generated by the forces F1 and F2 can rotate the wafer assembly 190 counterclockwise and reset the position of the wafer assembly 190 to the desired position.

In one embodiment, the distance between the movable wall 234*a* and the movable wall 234*b* (when both are in their resting positions) is adjustable. In one example, the distance between the movable wall 234*a* and the movable wall 234*b* (when both are in their resting positions) is adjusted to be substantially the same as the critical dimension of the wafer assembly 190 in the Y-direction shown in FIG. 5.

Referring back to FIG. 2, the first set of conveyor rollers 206*a*, driven by the first conveyor motor 208*a*, roll (i.e., rotate) and convey the wafer assembly 190; the second set of conveyor rollers 206*b*, driven by the second conveyor motor 208*b*, roll and convey the wafer assembly 190. In the example shown in FIG. 2, three of the first set of conveyor rollers 206*a* (namely, 206*a*-1, 206*a*-2, and 206*a*-3) are characterized by a roller cap 242.

Figure 6A:
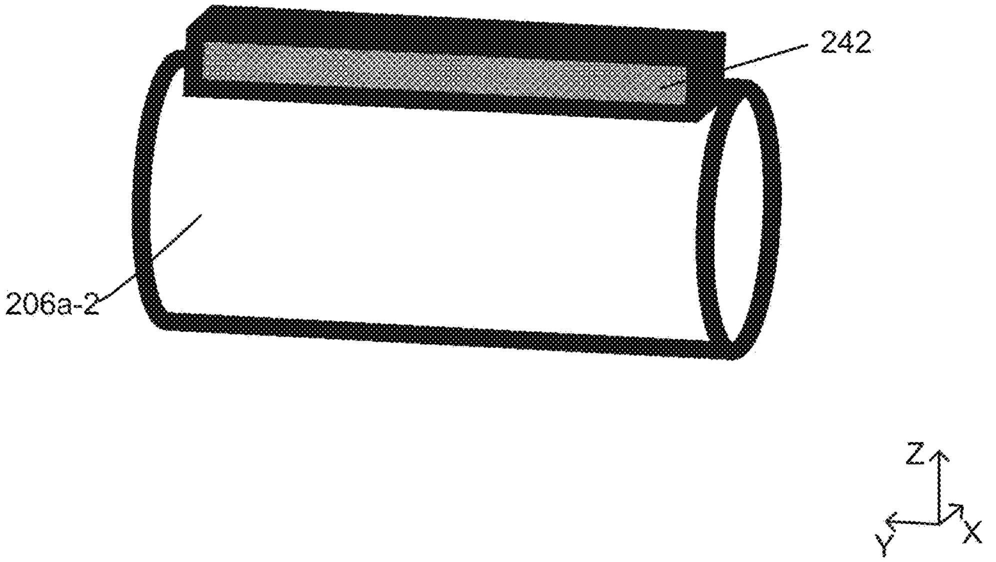
FIG. 6A is a diagram illustrating a perspective view of the conveyor roller 206*a*-2 and its corresponding roller cap 242 shown in FIG. 2 in accordance with some embodiments.
Figure 6B:
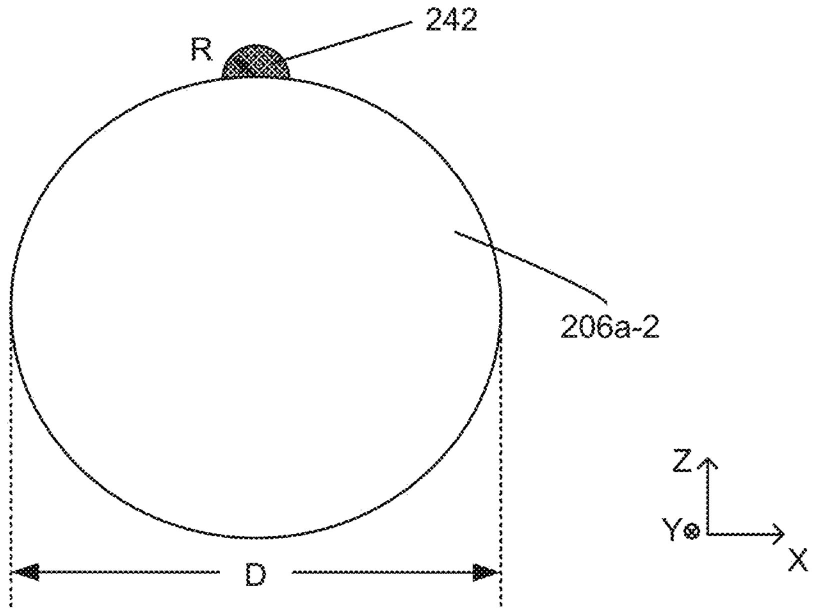
FIG. 6B is a diagram illustrating a cross-section view of the conveyor roller 206*a*-2 and its corresponding roller cap 242 shown in FIG. 2 in accordance with some embodiments.
Figure 7:
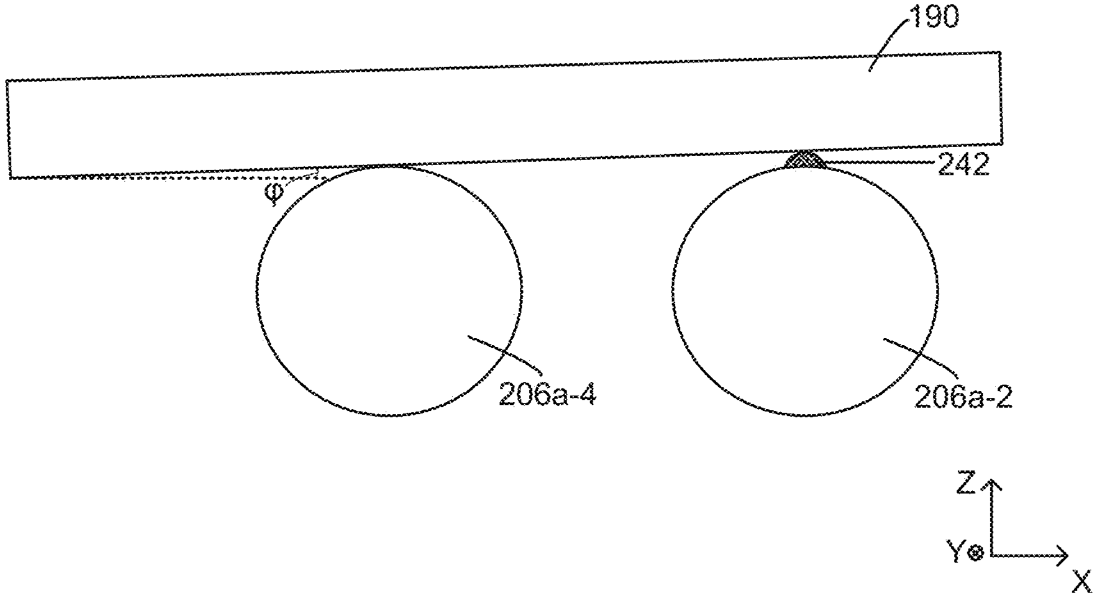
FIG. 7 is a diagram illustrating the interaction between a wafer assembly and two conveyor rollers in accordance with some embodiments.

FIG. 6A is a diagram illustrating a perspective view of the conveyor roller 206*a*-2 and its corresponding roller cap 242 in accordance with some embodiments. FIG. 6B is a diagram illustrating a cross-section view of the conveyor roller 206*a*-2 and its corresponding roller cap 242 in accordance with some embodiments. FIG. 7 is a diagram illustrating the interaction between the wafer assembly 190 and two conveyor rollers 206*a*-2 and 206*a*-4 in accordance with some embodiments. It should be understood that FIGS. 6A, 6B and 7 are not drawn to scale.

In the example shown in FIGS. 6A and 6B, the conveyor roller 206*a*-2 is a cylinder extending in the Y-direction, and the roller cap 242 is located at the surface of the conveyor roller 206*a*-2. The roller cap 242 extends in the Y-direction as well. The conveyor roller 206*a*-2 has a cross-sectional diameter D, as shown in FIG. 6A. In one embodiment, the roller cap 242 is a portion of a cylinder characterized by a cross-sectional radius R, as shown in FIG. 6B. In some embodiments, the cross-sectional radius R is larger than 0.5 mm and smaller than 3 mm. In some embodiments, the cross-sectional radius R is larger than 1 mm and smaller than 2 mm. In some embodiments, the cross-sectional radius R is larger than one-twelfth (i.e., 8.3%) of the cross-sectional diameter D and smaller than one-tenth (i.e., 10%) of the cross-sectional diameter D.

In some embodiments, the roller cap 242 is a separate and detachable piece attached to or mounted on the conveyor roller 206*a*-2. The detachable roller cap 242 makes it easier to upgrade existing conveyor rollers in a cost-effective manner. In other embodiments, the roller cap 242 and the conveyor roller 206*a*-2 are fabricated as on-piece using, for example, molding. The one-piece design can enhance the strength and reliability of the roller cap 242.

In some embodiments, the roller cap 242 is made of stainless steel. In other embodiments, the roller cap 242 is made of aluminum. It should be understood that these materials are exemplary rather than limiting, and the roller cap 242 can be made of other suitable materials as needed in other embodiments.

In the example shown in FIG. 7, the wafer assembly 190 is on the conveyor roller 206*a*-4 and 206*a*-2. If the conveyor roller 206*a*-2 does not have a roller cap 242, the normal force, due to the gravity of the wafer assembly 190, results in friction between the wafer assembly 190 and the conveyor rollers 206*a*-2 and 206*a*-4. The friction prevents the wafer assembly 190 from free movement horizontally to reset its position to the desired position.

In contrast, the presence of the roller cap 242 on the conveyor roller 206*a*-2 can raise the wafer assembly 190 to some extent, as shown in FIG. 7. The vertical movement of the wafer assembly 190, in a vertical direction (i.e., the Z-direction shown in FIG. 7) can be characterized by the angle φ shown in FIG. 7. The angle φ is defined as the angle between the horizontal plane (i.e., the X-Y plane) and the bottom surface of the wafer assembly 190.

Because of the vertical movement of the wafer assembly 190, the normal force between the wafer assembly 190 and the conveyor roller 206*a*-2 can be released momentarily. As a result, the friction that prevents the wafer assembly 190 from free movement horizontally is released momentarily as well, thereby facilitating the reset of the wafer assembly 190 to the desired position. The function of the pair of spring walls 204*a* and 204*b* can be further enhanced when the friction is released momentarily.

As the conveyor roller 206*a*-2 rotates, the roller cap 242 encounters the wafer assembly 190 periodically, assuming that the rotation speed of the conveyor roller 206*a*-2 is constant. Accordingly, the friction is released momentarily multiple times in some embodiments.

Figure 8:
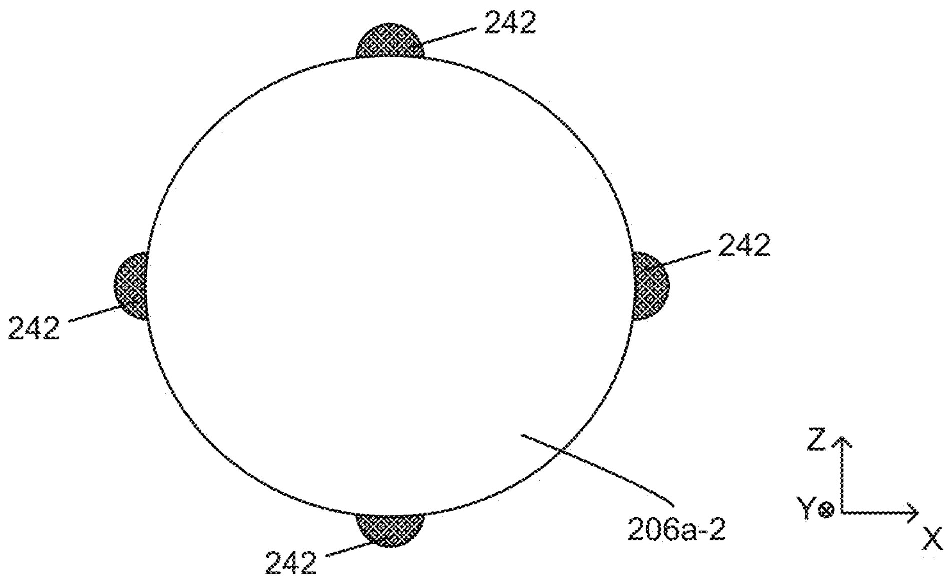
FIG. 8 is a diagram illustrating a cross-section view of an example conveyor roller and its corresponding roller caps in accordance with some embodiments.
Figure 9:
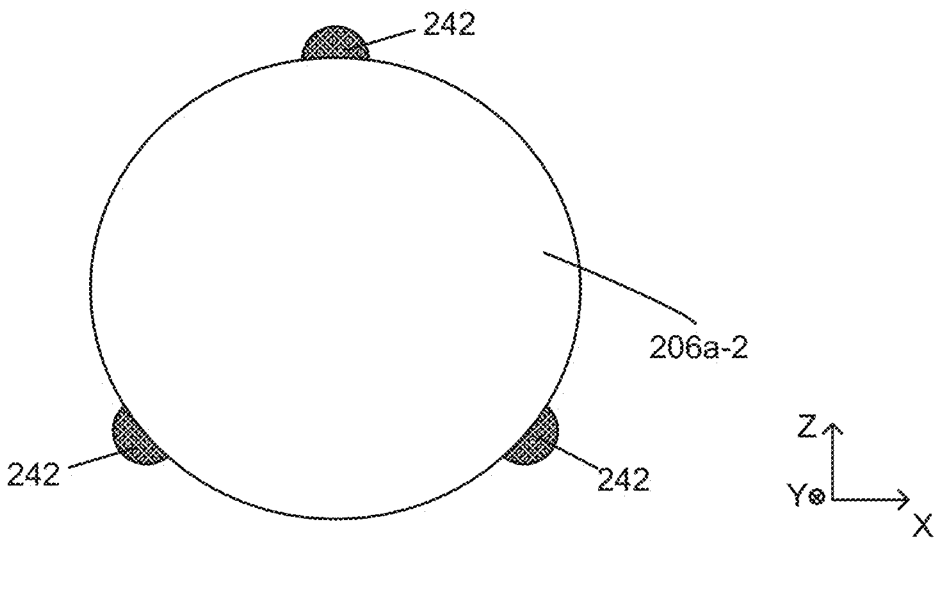
FIG. 9 is a diagram illustrating a cross-section view of another example conveyor roller and its corresponding roller caps in accordance with some embodiments.

FIG. 8 is a diagram illustrating a cross-section view of an example conveyor roller 206*a*-2 and its corresponding roller caps 242 in accordance with some embodiments. FIG. 9 is a diagram illustrating a cross-section view of another example conveyor roller 206*a*-2 and its corresponding roller caps 242 in accordance with some embodiments. It should be understood that FIGS. 8 and 9 are not drawn to scale.

Although only one roller cap 242 is used in the example shown in FIGS. 6A, 6B, and 7, it is not intended to be limiting, and more than one roller caps 242 can be used. In the example shown in FIG. 8, there are four roller caps 242 located at the surface of the conveyor roller 206*a*-2. The roller caps 242 extend in the Y-direction and are spaced evenly from each other. In the example shown in FIG. 9, there are three roller caps 242 located at the surface of the conveyor roller 206*a*-2. The roller caps 242 extend in the Y-direction and are spaced evenly from each other. It should be understood that there may be two or more than four roller caps 242 located at the surface of the conveyor roller 206*a*-2 in other embodiments.

Also, it should be understood that not all the conveyor rollers 206*a* and 206*b* are characterized by at least one roller cap 242. In the example shown in FIG. 2, three of the nine conveyor rollers 206*a* are characterized by at least one roller cap 242, and those three conveyor rollers 206*a*-1, 206*a*-2, and 206*a*-3 are located at the beginning, the middle, and the end of the conveyor rollers 206*a* in the X-direction (i.e., the direction in which the wafer assembly 190 advances). Likewise, three of the nine conveyor rollers 206*b* are characterized by at least one roller cap 242, and those three conveyor rollers 206*b*-1, 206*b*-2, and 206*b*-3 are located at the beginning, the middle, and the end of the conveyor rollers 206*b* in the X-direction (i.e., the direction in which the wafer assembly 190 advances).

In other embodiments, more than three of the conveyor rollers 206*a* are characterized by at least one roller cap 242; more than three of the conveyor rollers 206*b* are characterized by at least one roller cap 242.

Figure 10:
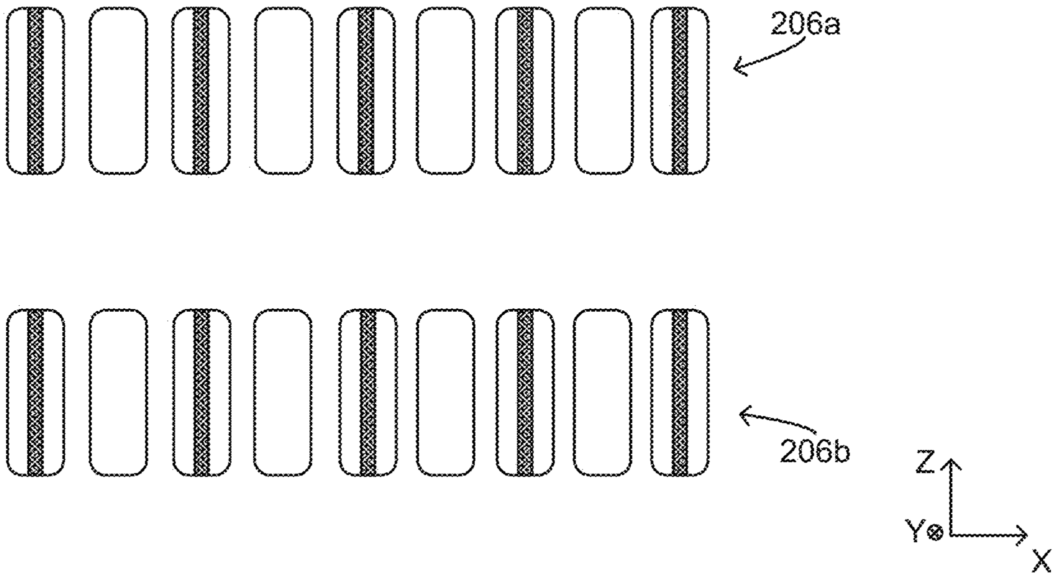
FIG. 10 is a diagram illustrating an example roller cap configuration in accordance with some embodiments.
Figure 11:
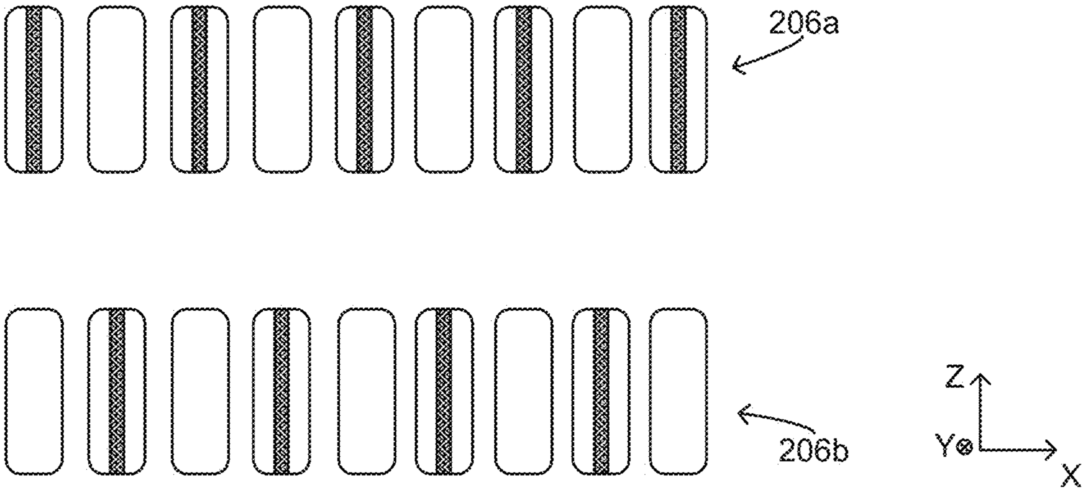
FIG. 11 is a diagram illustrating another example roller cap configuration in accordance with some embodiments.

FIG. 10 is a diagram illustrating an example roller cap configuration in accordance with some embodiments. FIG. 11 is a diagram illustrating another example roller cap configuration in accordance with some embodiments. In the configuration shown in FIG. 10, five of the nine conveyor rollers 206*a* are characterized by at least one roller cap 242, and the conveyor rollers 206*a* that are characterized by at least one roller cap and the remaining conveyor rollers 206*a* are in an alternate pattern; five of the nine conveyor rollers 206*b* are characterized by at least one roller cap 242, and the conveyor rollers 206*b* that are characterized by at least one roller cap and the remaining conveyor rollers 206*b* are in an alternate pattern as well. In addition, the alternating pattern for the conveyor rollers 206*a* and the alternating pattern for the conveyor rollers 206*b* are identical in the X-direction.

In the configuration shown in FIG. 11, five of the nine conveyor rollers 206*a* are characterized by at least one roller cap 242, and the conveyor rollers 206*a* that are characterized by at least one roller cap and the remaining conveyor rollers 206*a* are in an alternate pattern; four of the nine conveyor rollers 206*b* are characterized by at least one roller cap 242, and the conveyor rollers 206*b* that are characterized by at least one roller cap and the remaining conveyor rollers 206*b* are in an alternate pattern as well. In addition, the alternating pattern for the conveyor rollers 206*a* and the alternating pattern for the conveyor rollers 206*b* are complementary in the X-direction. For example, the leftmost of the nine conveyor rollers 206*a* is characterized by at least one roller cap 242, whereas the leftmost of the nine conveyor rollers 206*b* is not characterized by at least one roller cap 242.

One of ordinary skill in the art would recognize many variations, modifications, and alternatives in view of FIGS. 2, 10, and 11.

The wafer stopper 210 is located at the distant end 294. The wafer stopper 210 is configured to stop the wafer assembly 190, and the wafer assembly 190 is subsequently transferred, by the transfer robot 106, to the buffer station 108. In some embodiments, the wafer stopper 210 further includes some positioning sensors (e.g., laser sensors) that can determine whether the wafer assembly 190 reaches a certain location.

Example Method for Processing a Wafer Assembly

Figure 12:
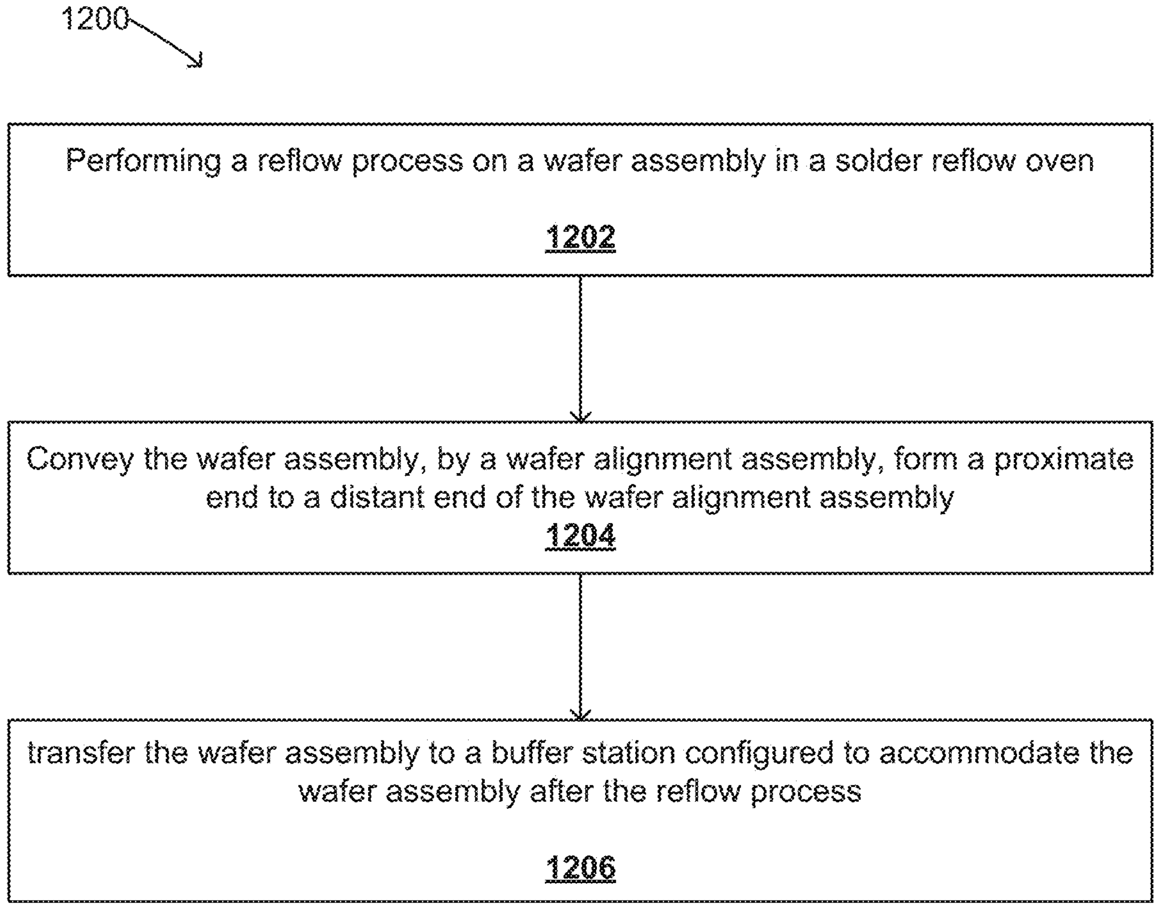
FIG. 12 is a flowchart illustrating an example method for processing a wafer assembly in a solder reflow system in accordance with some embodiments.

FIG. 12 is a flowchart illustrating an example method 1200 for processing a wafer assembly in a solder reflow system in accordance with some embodiments. In the example shown in FIG. 12, the method 1200 includes operations 1202, 1204, and 1206. Additional operations may be performed. Also, it should be understood that the sequence of the various operations discussed above with reference to FIG. 12 is provided for illustrative purposes, and as such, other embodiments may utilize different sequences. These various sequences of operations are to be included within the scope of embodiments.

At operation 1202, a reflow process is performed on a wafer assembly (e.g., the wafer assembly 190 shown in FIG. 1) in a solder reflow oven (e.g., the solder reflow oven 102 shown in FIG. 1).

At operation 1204, the wafer assembly is conveyed, by a wafer alignment assembly (e.g., the wafer alignment assembly 104 shown in FIG. 2), from a proximate end to a distant end of the wafer alignment assembly.

At operation 1206, the wafer assembly is transferred to a buffer station (e.g., the buffer station 108 shown in FIG. 1) configured to accommodate the wafer assembly after the reflow process.

Advantages

Consequently, the following advantages can be achieved. The possibility of wafer collision and wafer scrap is reduced. The wafer assembly is prevented from being stuck. Manpower in the semiconductor processing can be saved. The troubleshooting period, if there is any, can be shortened.

In one example, the wafer scrap can be reduced from 1.5 pieces per month to zero; the manpower needed can be reduced by 80% (from 0.5 units to 0.1 units); the troubleshooting period can be reduced from 3.2 hours per day to zero; the platform available time can be increased by 6%.

SUMMARY

In accordance with some aspects of the disclosure, a wafer alignment assembly is provided. The wafer alignment assembly includes: a first tapered wall extending in a first horizontal direction; a first spring wall attached to an inner surface of the first tapered wall; a first set of conveyor rollers configured to rotate; a second tapered wall extending in the first horizontal direction, wherein the first tapered wall and the second tapered wall are characterized by a tapered shape that facilitates entry of a wafer assembly; a second spring wall attached to an inner surface of the first tapered wall; and a second set of conveyor rollers configured to rotate.

In accordance with some aspects of the disclosure, a solder reflow system is provided. The solder reflow system includes: a solder reflow oven configured to perform a reflow process; a buffer station configured to accommodate wafer assemblies after the reflow process; and a wafer alignment assembly located between the solder reflow oven and the buffer station. The wafer alignment assembly includes: a first tapered wall extending in a first horizontal direction; a first spring wall attached to an inner surface of the first tapered wall; a first set of conveyor rollers configured to rotate; a second tapered wall extending in the first horizontal direction, wherein the first tapered wall and the second tapered wall are characterized by a tapered shape that facilitates entry of a wafer assembly; a second spring wall attached to an inner surface of the first tapered wall; and a second set of conveyor rollers configured to rotate.

In accordance with some aspects of the disclosure, a method is provided. The method includes the following steps: performing a reflow process on a wafer assembly; and conveying the wafer assembly, by a wafer alignment assembly, from a proximate end to a distant end of the wafer alignment assembly. The wafer alignment assembly includes: a first tapered wall extending in a first horizontal direction; a first spring wall attached to an inner surface of the first tapered wall; a first set of conveyor rollers configured to rotate; a second tapered wall extending in the first horizontal direction, wherein the first tapered wall and the second tapered wall are characterized by a tapered shape that facilitates entry of the wafer assembly; a second spring wall attached to an inner surface of the first tapered wall; and a second set of conveyor rollers configured to rotate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer alignment assembly comprising:
- a first tapered wall extending in a first horizontal direction;
- a first spring wall attached to an inner surface of the first tapered wall;
- a first set of conveyor rollers configured to rotate;
- a second tapered wall extending in the first horizontal direction, wherein the first tapered wall and the second tapered wall comprise respective tapered segments at a proximate end of the wafer alignment assembly, each tapered segment characterized by a taper angle that widens a distance between the first tapered wall and the second tapered wall toward the proximate end, thereby facilitating entry of a wafer assembly;
- a second spring wall attached to an inner surface of the second tapered wall; and
- a second set of conveyor rollers configured to rotate.

2. The wafer alignment assembly of claim 1, wherein the first tapered wall comprises:
- a first elongated segment extending in the first horizontal direction; and
- a first one of the respective tapered segments being at the proximate end of the wafer alignment assembly in the first horizontal direction.

3. The wafer alignment assembly of claim 2, wherein the second tapered wall comprises:
- a second elongated segment extending in the first horizontal direction; and
- a second one of the respective tapered segments being at the proximate end of the wafer alignment assembly in the first horizontal direction.

4. The wafer alignment assembly of claim 3, wherein the first tapered segment is characterized by a first taper angle, and the second tapered segment is characterized by a second taper angle.

5. The wafer alignment assembly of claim 4, wherein the first taper angle and the second taper angle are identical.

6. The wafer alignment assembly of claim 3, wherein a length of the first elongated segment and a length of the second elongated segment in the first horizontal direction are larger than half of a critical dimension of the wafer assembly in the first horizontal direction.

7. The wafer alignment assembly of claim 3, wherein the first spring wall comprises:

a first fixed wall extending in the first horizontal direction and attached to the inner surface of the first tapered wall;

a first movable wall extending in the first horizontal direction operable to move with respect to the first fixed wall; and at least three first adjustable connection mechanisms distributed in the first horizontal direction, wherein each first adjustable connection mechanism extends substantially in a second horizontal direction perpendicular to the first horizontal direction and is capable of adjusting its length in the second horizontal direction.

8. The wafer alignment assembly of claim 7, wherein the second spring wall comprises:

a second fixed wall extending in the first horizontal direction and attached to the inner surface of the second tapered wall;

a second movable wall extending in the first horizontal direction operable to move with respect to the second fixed wall; and at least three second adjustable connection mechanisms distributed in the first horizontal direction, wherein each second adjustable connection mechanism extends substantially in the second horizontal direction and is capable of adjusting its length in the second horizontal direction.

9. The wafer alignment assembly of claim 1, wherein at least one of the first set of conveyor rollers is characterized by a roller cap.

10. The wafer alignment assembly of claim 1, wherein at least one of the second set of conveyor rollers is characterized by a roller cap.

11. A solder reflow system comprising:

a solder reflow oven configured to perform a reflow process;

a buffer station configured to accommodate wafer assemblies after the reflow process; and a wafer alignment assembly located between the solder reflow oven and the buffer station and comprising:

a first tapered wall extending in a first horizontal direction;

a first spring wall attached to an inner surface of the first tapered wall;

a first set of conveyor rollers configured to rotate;

a second tapered wall extending in the first horizontal direction, wherein the first tapered wall and the second tapered wall comprise respective hypotenuses at a proximate end of the wafer alignment assembly, each hypotenuse widens a distance between the first tapered wall and the second tapered wall toward the proximate end;

a second spring wall attached to an inner surface of the first tapered wall; and a second set of conveyor rollers configured to rotate.

12. The solder reflow system of claim 11, wherein the first tapered wall comprises: a first elongated segment extending in the first horizontal direction; and a first tapered segment at the proximate end of the wafer alignment assembly in the first horizontal direction, wherein the second tapered wall comprises: a second elongated segment extending in the first horizontal direction; and a second tapered segment at the proximate end of the wafer alignment assembly in the first horizontal direction, and wherein each of the first tapered segment and the second tapered segment includes the hypotenuse.

13. The solder reflow system of claim 12, wherein the first spring wall comprises:

a first fixed wall extending in the first horizontal direction and attached to the inner surface of the first tapered wall;

a first movable wall extending in the first horizontal direction operable to move with respect to the first fixed wall; and at least three first adjustable connection mechanisms distributed in the first horizontal direction, wherein each first adjustable connection mechanism extends substantially in a second horizontal direction perpendicular to the first horizontal direction and is capable of adjusting its length in the second horizontal direction.

14. The solder reflow system of claim 13, wherein the second spring wall comprises:

a second fixed wall extending in the first horizontal direction and attached to the inner surface of the second tapered wall;

a second movable wall extending in the first horizontal direction operable to move with respect to the second fixed wall; and at least three second adjustable connection mechanisms distributed in the first horizontal direction, wherein each second adjustable connection mechanism extends substantially in the second horizontal direction and is capable of adjusting its length in the second horizontal direction.

15. The solder reflow system of claim 11, wherein at least one of the first set of conveyor rollers is characterized by a first roller cap, and at least one of the second set of conveyor rollers is characterized by a second roller cap.

16. The solder reflow system of claim 15, the first roller cap is located at the surface of one of the first set of conveyor rollers and extends in a second horizontal direction perpendicular to the first horizontal direction, and the first roller cap is operable to raise one of the wafer assemblies in a vertical direction.

17. A wafer alignment assembly comprising:

a first tapered wall extending in a first horizontal direction; a first spring wall attached to an inner surface of the first tapered wall;

a second tapered wall extending in the first horizontal direction;

a second spring wall attached to an inner surface of the first tapered wall; and a set of conveyor rollers configured to rotate;

wherein at least one conveyor roller of the set of conveyor rollers comprises a roller cap comprising a raised portion extending along a surface of the at least one conveyor roller and extending radially beyond the surface of the at least one conveyor roller, the roller cap configured to lift a wafer assembly as the at least one conveyor roller rotates, thereby momentarily releasing friction between the wafer assembly and the set of conveyor rollers.

18. The wafer alignment assembly of claim 17, wherein the roller cap comprises a portion of a cylinder characterized by a cross-sectional radius.

19. The wafer alignment assembly of claim 17, wherein the roller cap comprises stainless steel or aluminum.

20. The wafer alignment assembly of claim 17, wherein the set of conveyor rollers includes a plurality of conveyor rollers characterized by roller caps and a plurality of conveyor rollers without roller caps, arranged in an alternating pattern.

* * * * *